US012787693B2

(12) United States Patent
Rohringer et al.

(10) Patent No.: US 12,787,693 B2
(45) Date of Patent: Nov. 3, 2026

(54) DEVICE AND METHOD FOR ADJUSTING A DETECTION MEANS

(71) Applicant: EV Group E. Thallner GmbH, St. Florian am Inn (AT)

(72) Inventors: Harald Rohringer, St. Florian am Inn (AT); Martin Finger, St. Florian am Inn (AT); Dominik Zinner, St. Florian am Inn (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 379 days.

(21) Appl. No.: 18/701,683

(22) PCT Filed: Dec. 17, 2021

(86) PCT No.: PCT/EP2021/086381

§ 371 (c)(1),
(2) Date: Apr. 16, 2024

(87) PCT Pub. No.: WO2023/110114

PCT Pub. Date: Jun. 22, 2023

(65) Prior Publication Data

US 2024/0420976 A1 Dec. 19, 2024

(51) Int. Cl.
*H10P 72/50* (2026.01)
*H10P 72/00* (2026.01)

(52) U.S. Cl.
CPC ...... *H10P 72/0606* (2026.01); *H10P 72/0618* (2026.01); *H10P 72/53* (2026.01)

(58) Field of Classification Search
CPC ............. H10P 72/0606; H10P 72/0618; H10P 72/53; H10W 46/00; H10W 46/301
See application file for complete search history.

(56) References Cited

U.S. PATENT DOCUMENTS

| | | | | |
|---|---|---|---|---|
| 5,843,831 | A * | 12/1998 | Chung | G03F 9/7076 257/E23.179 |
| 6,214,692 | B1 | 4/2001 | Thallner | |
| 9,418,882 | B2 * | 8/2016 | Thallner | B65G 47/26 |
| 10,629,416 | B2 | 4/2020 | Kogler et al. | |
| 10,692,747 | B2 * | 6/2020 | Wagenleitner | H10P 72/0428 |
| 10,943,807 | B2 | 3/2021 | Wagenleitner et al. | |
| 11,387,081 | B2 | 7/2022 | Kogler et al. | |
| 11,488,851 | B2 | 11/2022 | Wagenleitner et al. | |
| 11,605,550 | B2 * | 3/2023 | Yang | G03F 7/70616 |
| 12,368,110 | B2 * | 7/2025 | Ye | H10W 46/00 |

(Continued)

FOREIGN PATENT DOCUMENTS

| | | | |
|---|---|---|---|
| CN | 111354714 | A | 6/2020 |
| CN | 111933618 | A | 11/2020 |

(Continued)

OTHER PUBLICATIONS

International Search Report from corresponding International Patent Application No. PCT/EP2021/086381, dated Jul. 21, 2022.

(Continued)

*Primary Examiner* — Alvin H Tan
(74) *Attorney, Agent, or Firm* — RENNER, OTTO, BOISSELLE & SKLAR,

(57) ABSTRACT

The invention relates to a method and a device for adjusting a detection means with the aid of adjustment marks arranged one above the other.

15 Claims, 4 Drawing Sheets

(56) References Cited

U.S. PATENT DOCUMENTS

| | | | | |
|---|---|---|---|---|
| 2006/0023214 | A1* | 2/2006 | Lof | G03F 9/7084 356/401 |
| 2009/0180095 | A1* | 7/2009 | Alberti | G03F 7/70633 355/72 |
| 2011/0058731 | A1* | 3/2011 | Crespin | G03F 7/70425 382/151 |
| 2016/0148826 | A1 | 5/2016 | Thallner | |
| 2018/0211821 | A1* | 7/2018 | Kogler | C23C 16/4583 |
| 2019/0198371 | A1 | 6/2019 | Wagenleitner et al. | |
| 2020/0219746 | A1 | 7/2020 | Yang et al. | |
| 2020/0227299 | A1 | 7/2020 | Wagenleitner et al. | |
| 2020/0251314 | A1 | 8/2020 | Kogler et al. | |
| 2020/0333136 | A1 | 10/2020 | Wagenleitner et al. | |
| 2021/0151339 | A1 | 5/2021 | Wagenleitner et al. | |
| 2023/0290732 | A1 | 9/2023 | Ye et al. | |

FOREIGN PATENT DOCUMENTS

| | | | |
|---|---|---|---|
| DE | 10 2018 100 066 | A1 | 7/2018 |
| EP | 3 734 650 | A1 | 11/2020 |
| JP | 2019530206 | A | 10/2019 |
| JP | 2021517960 | A | 7/2021 |
| JP | 2021173866 | A | 11/2021 |
| WO | WO-2014/202106 | A1 | 12/2014 |
| WO | WO-2022/032825 | A1 | 2/2022 |

OTHER PUBLICATIONS

International Preliminary Report on Patentability from corresponding International Patent Application No. PCT/EP2021/086381, dated Nov. 7, 2023.

Notification of Reasons for Refusal issued in related Japanese Patent Application No. 2024-522586 dated Nov. 4, 2025.

* cited by examiner

DEVICE AND METHOD FOR ADJUSTING A DETECTION MEANS

FIELD OF THE INVENTION

The present invention relates to a device and method for adjusting a detection means. The device and the method are particularly well suited for adjusting detection means in alignment and processing systems of the semiconductor industry.

BACKGROUND OF THE INVENTION

In the semiconductor industry, alignment systems are used to align substrates, in particular wafers, with one another or to align them with other components. Substrates can have any shape, but are preferably circular. The diameter of the substrates is in particular industrially standardised. For wafers, industrially standard diameters are 1 inch, 2 inches, 3 inches, 4 inches, 5 inches, 6 inches, 8 inches, 12 inches und 18 inches.

The jointing of aligned semiconductor substrates is referred to as bonding. An alignment of the substrates or the substrate as exact as possible is required to avoid bonding errors and to keep the rejection rate low. In addition, the maximum possible accuracy is required for many applications. For this purpose, alignment marks on the substrates or the substrate holders are measured relative to one another. In particular, optical detection means are used for this, by means of which the alignment marks are detected and the substrates are aligned.

For example, in bonding the substrates to be bonded are aligned with one another and bonded together in a further process step. A particularly precise alignment of the substrates with one another is always required. In the following text, bonding is preferably fusion bonding. Alignment processes, in which the alignment markings are present on the substrate surfaces to be bonded, are referred to as face-to-face alignments. Larger alignment errors also arise due to greater traversing paths during alignment.

A further problem with the prior art is that increasing alignment accuracy demands can no longer be achieved with simple means. Regarding methods in which substrates are measured relative to reference points and are aligned blind for example after the approach for the contacting, the new alignment accuracy demands are not met.

For example, publication U.S. Pat. No. 6,214,692B1 is based on the comparison and the position correction of two images of adjustment markings. The position of the alignment markings on the two substrates arranged face-to-face is detected individually by means of a camera system. From a calculated relative position and relative location of the alignment markings, a positioning table (substrate holder and stage) is steered in such a way that the incorrect position is corrected.

The further publication U.S. Pat. No. 10,692,747B2 is based on the comparison and the position correction of a total of three images of planar alignment markings. The position of alignment markings on the two substrates arranged face-to-face is detected individually by means of a camera system. A third alignment marking is detected by a third detection unit, with which a correlation of an alignment mark of the substrate with the rear side of the substrate holder or with the rear side of the substrate is produced, so that a more precise alignment of the two substrates is enabled.

To this extent, a visual check in a face-to-face alignment of two substrates is not possible or is only possible when at least one of the substrates is at least partially transparent. A precise alignment of the surfaces in the case of a face-to-face alignment is thus only possible in an expensive and limited manner.

It has been found to be particularly disadvantageous that the optical detection means of the individual alignment markings are positioned in an imprecisely defined position with respect to the substrate holder and therefore also with respect to the substrate subsequently arranged on the substrate holder. As a result of the imprecise position of the detection means, the detection of the individual alignment markings usually requires a readjustment movement in the lateral plane of the substrate holder and a focusing movement. On account of the in particular controlled movements of the detection means, the spatial position of the detection means, in particular optical detection means, for example measuring microscopes, is often so imprecise that a precise measurement and thus a sufficiently precise alignment of the substrate stack is not possible with the aid thereof.

The readjustment movements especially of the optics for detecting the alignment marks run, besides the required movement, with parasitic movements superimposed thereon, which cause deviations from the ideal movement of the given optics. A tilted position of the central axis of the detection means can thus occur with a movement, which in turn has a negative effect on the alignment accuracy.

It is an aim of the present invention, therefore, to specify an improved device and an improved method for adjusting a detection means, which at least partially removes, in particular completely removes, the drawbacks listed in the prior art. It is also an aim of the present invention to specify an improved device and an improved method for adjusting a detection means. Furthermore, it is an aim of the present invention to specify a device and a method for adjusting a detection means, which takes account of the angular position relative to the substrate holder and can be carried out easily. It is in particular a further aim of the present invention to specify a method and a device for the improved alignment of substrates, which particularly reliably, accurately and simply determines and compensates for, i.e. adjusts, a wedge error between the substrate holder and the detection means.

SUMMARY OF THE INVENTION

The present aim is solved with the features of the coordinated claims. Advantageous developments of the invention are given in the sub-claims. All combinations of at least two features stated in the description, in the claims and/or the drawings also fall within the scope of the invention. In stated value ranges, values lying within the stated limits should also be deemed to be disclosed as limiting values and can be claimed in any combination.

Accordingly, the invention relates to a device for adjusting a detection means, at least including:

i) a substrate holder for mounting a substrate, ii) at least one adjustment marking field with adjustment marks arranged fixed with respect to the substrate holder and iii) the detection means for detecting the adjustment marks, characterised in that the detection means can be adjusted relative to the substrate holder with the aid of the adjustment marks of the adjustment marking field arranged one above the other.

Furthermore, the invention relates to a method for adjusting a detection means with at least the following steps:

i) Providing a substrate holder with an adjustment marking field with adjustment marks arranged fixed with respect to this substrate holder and ii) Adjusting the detection means relative to the substrate holder, characterised in that the adjustment means are adjusted with the aid of adjustment marks of the adjustment marking field arranged one above the other.

In another words, the detection means is advantageously aligned with the aid of two adjustment markings of an adjustment marking field arranged one above the other at a different height. Particularly preferably, a wedge error (angular error) between the detection means and the substrate holder is compensated for. A tilted position of the detection means can thus be adjusted and calibrated with the aid of a single adjustment marking field with adjustment marks arranged one above the other. In the present document, the terms wedge error and angular error are used synonymously.

Since the detection means is designed also for reading alignment marks (on the substrate or on the substrate holder), preferably simultaneously, during bonding, the alignment accuracy is thus also increased by the previous adjustment. In addition, the substrate holder in particular is designed for the mounting and preparation of a substrate that is as planar as possible. The adjustment marking field is arranged fixed relative to the substrate holder, so that the respective adjustment marks also have a specific or known position in respect of the substrate holder. The respective position of the individual adjustment marks in the adjustment marking field is preferably known, so that after a detection of two adjustment marks arranged one above the other by the detection means, an alignment can be carried out with the aid of the detected adjustment markings with the known position. In addition, the detection means or a parallel axis error can be compensated for without a relative movement parallel to the substrate holder (x-y axis) with the aid of the adjustment marks arranged one above the other. After such an adjustment, the detection axis of the detection means is in particular aligned at right angles the substrate holder, so that a tilted position is no longer present or an angular error of the detection means can be eliminated by the device. Since each unknown angular error of a detection means can also cause an alignment error, the rejection rate in the substrate processing is thus also reduced.

In addition, the detection marks can be moved in particular by means of a movement device in particular along a focal axis (at right angles to the substrate holder in the z-direction). A tilted or oblique position of the detection unit can preferably also be compensated for by especially sensitive actuators. The determined wedge error between the detection unit and the substrate holder or the substrate mounting surface of the substrate holder can also take place by a compensation movement of the substrate holder.

The adjustment marks are in particular markings affixed on and/or in the substrate holder, which enable at least one adjustment of the adjustment means relative to the substrate holder. A plurality of adjustment marking fields each with their own adjustment marks in specific areas, which are preferably aligned with the positions of subsequent alignment marks, are preferably distributed over the substrate holder.

The detection unit can thus advantageously detect adjustment marks of an adjustment marking field irrespective of the x-y position. In addition, a further movement for reading out the alignment marks is then possible, without the detection means having to move in the x-y direction.

A particular advantage of the device and the method for the adjustment is that a reference wafer or another additional measurement system is not necessary to align the detection means and the substrate holder with one another. This form of calibration can thus advantageously take place simply and often between the individual processing steps. A further very special advantage of the device and the method for adjustment is that, by means of a plurality of adjustment marking fields at the different positions, the detection means is specially adjusted where a measurement is also carried out. External influences, such as for example the sagging of the table due to the weight of the optics, are thus taken into account and cannot subsequently cause a tilting position of the detection device.

A substrate holder with at least one adjustment marking field can include a plurality of discrete components. The substrate mounting surface is preferably a reproducibly, at least slightly deformable plate, which in particular is held without constraint in the substrate holder. An adjustment marking field includes at least one adjustment mark and one further adjustment mark.

The adjustment marking field is arranged fixed with respect to the substrate holder or to the substrate holder surface. In particular, the precise position of the adjustment marking field and the respective position of the adjustment marks in the adjustment marking field relative to the or on the substrate holder is known. The adjustment marks or at least two adjustment marks of the adjustment marking field arranged one above the other.

In a preferred embodiment of the device, provision is made such that the adjustment marks of the adjustment marking field are arranged in a first plane and a second plane, and wherein the first plane and the second plane are parallel with one another, and wherein the first plane and the second plane have a distance from one another. In other words, the adjustment marks of different planes have a known and constant distance from one another. In this way, an adjustment can advantageously be carried out precisely. The planes of all the adjustment marking fields are preferably arranged identically with respect to the substrate holder. With the aid of the known distance, the wedge error between the detection means and the substrate holder can thus advantageously be determined, in particular calculated, precisely.

In a further preferred embodiment of the device, provision is made such that the detection means can be adjusted by a relative movement between the detection means and the substrate holder. In other words, after a detection of a first adjustment mark of a first plane, a second adjustment mark of a second plane of the adjustment marking field is detected by a movement of the substrate holder or the detection means in the z-direction. The length of the path of the movement can be compared with the distance between the planes of the adjustment marking field and a tilted position or wedge error can thus be determined.

In a further preferred embodiment of the device, provision is made such that the detection means can be adjusted by a change of focus of the detection means. In other words, the detection means shifts its focal range in order to detect the respective other adjustment mark. This focusing movement advantageously takes place without a relative movement of the detection means or the substrate holder. With the aid of the focusing movement, e.g. of the optics, the distance thus determined between the adjustment marks of different planes is thus measured and compared with the known distance. In this way, a particularly precise adjustment of the substrate holder with respect to the detection means is possible without an error as a result of the relative movement. With this refocusing of the detection means, lateral displacements can be detected and correspondingly corrected, if during the focusing movement an apparent lateral offset of the adjustment marks of two planes is detected. The substrate holder preferably remains fixed in its position.

In a further preferred embodiment of the device, provision is made such that the adjustment marks of the first plane and the adjustment marks of the second plane are arranged aligned one above the other. In this case, the adjustment marking field and the detection means are constituted such that the detection of different aligned adjustment marks is possible. For example, the adjustment marking field is transparent for certain wavelengths.

In a further preferred embodiment of the device, provision is made such that the adjustment marks of the first plane and the adjustment marks of the second plane are arranged above one another and regularly offset with respect to one another. In this way, the adjustment marks can advantageously easily be detected by the detection unit.

In a further preferred embodiment of the device, provision is made such that the adjustment marks of the first plane and the adjustment marks of the second plane are arranged offset steplike with respect to one another on different layers. In this way, material of the adjustment marking fields advantageously does not conceal the adjustment marks of different planes. Furthermore, a selection can be made from a plurality of detection means.

In further preferred embodiment of the device, provision is made such that the adjustment marks each additionally include an individual information content detectable by the detection means. In this way, the position of the respectively detected adjustment mark in the adjustment marking field and/or in respect of the substrate holder is known. The known x-y positions of the adjustment marks as well as their individual pattern (e.g. pixels) positions are advantageously known. The information content (provided for example as a barcode) can thus advantageously be included in the determination of the wedge error. A still more precise and more reliable determination of the wedge error is thus possible. Furthermore, a subsequent relative determination of the position of the substrate is enabled by means of the alignment marks.

In a further preferred embodiment of the device, provision is made such that the detection means is an optical detection means, in particular a lens with an optical central axis which can be determined. This central axis in an optimum alignment stands precisely at right angles to the substrate holder or the substrate holder surface and thus also on the adjustment marks. With the aid of refocusing or a change of focus, the shift in the focal range along the optical central axis can thus be determined particularly exactly.

In a further preferred embodiment of the device, provision is made such that the substrate holder includes on a substrate holder surface regularly arranged elevations for providing a surface mounting surface and a plurality of adjustment marking fields each including adjustment marks are arranged regularly offset with respect to one another between the elevations. The elevations are preferably studs or pins. In this way, the contact area between the substrate and the substrate holder or the substrate mounting surface is advantageously small, so that contamination of the surfaces of the substrates can be minimised, or prevented. By means of a plurality of adjustment marking fields arranged between the elevations, the wedge errors can advantageously be determined at a plurality of positions. A relative movement of the detection means in the x-y direction, i.e. along the substrate surface, is thus not necessary. On the contrary, the wedge error can thus advantageously be determined precisely and independently of the position by the detection means and the detection means can be precisely aligned or adjusted.

In a further preferred embodiment of the device, provision is made such that the at least one adjustment marking field relative to the substrate holder surface has a smaller height than the elevations. The elevations thus project in respect of the substrate holder surface relative to the adjustment marking fields. In this way, the substrate advantageously cannot be contaminated by the adjustment marking fields, since the contact takes place solely with the elevations provided for the purpose.

In a further preferred embodiment of the device, provision is made such that one of the two planes of the at least one adjustment marking field lies on the substrate holder surface. In other words, a plane of the adjustment marking field is formed by the substrate holder surface. The adjustment marks can be partially embedded in the substrate holder or arranged beneath the substrate holder surface. In this way, the adjustment marking field can be constituted particularly easily and less prone to error. In addition, the adjustment marking fields can be integrated directly into the substrate holder.

In a further preferred advantageous embodiment of the device, provision is made such that the at least one adjustment marking field is embedded completely into the substrate holder and is arranged at least partially beneath the substrate holder surface. In other words, the planes are impressed into the substrate holder and have a negative height profile with respect of the substrate holder surface. In this way, the adjustment marking field can advantageously be embedded in the substrate holder and be directly produced in production. In addition, the adjustment marking fields are advantageously protected.

In a further preferred embodiment of the device, provision is made such that the detection means can be used for reading out alignment markings of a substrate. The adjustment marking fields are particularly preferably arranged in areas of the substrate holder surface which are typically aligned with the positions of the alignment marking fields of the substrates or of the substrate holder. The detection means can thus advantageously also carry out the alignment of the alignment markings, without a relative movement having to be performed in the x-y direction. On the contrary, the detection means can advantageously remain unmoved and can carry out the read-out by means of a focusing movement or a shifting of the focal range.

In an embodiment of the device, the device is constituted encapsulated, so that at least the substrate holder and the detection means are incorporated in a system chamber which can be closed off gas-tight and/or vacuum-tight from the atmosphere.

The corresponding auxiliary units contain for example accesses, locks, pumps, sensors, inspection windows, gas supplies and temperature controls. In this embodiment, the system chamber can be filled with a special atmosphere, which is preferably free from water or water vapour. Furthermore, the special atmosphere can be free from oxygen. In a further embodiment, the system chamber can be subjected to a vacuum, preferably to a high vacuum, particularly preferably to an ultrahigh vacuum. The vacuum in the system chamber of this embodiment amounts to less than 1*10E-3 mbar, preferably less than 1*10E-5 mbar, particularly preferably less than 1*10E-8 mbar, very particular preferably less than 5*10E-9 mbar, most preferably less than 1*10E-10 mbar, in the ideal case less than 1*10E-12 mbar.

In a preferred embodiment of the method, provision is made such that the adjustment of the detection means in step ii) includes the following steps with the following sequence:

a) detection of a first adjustment mark of a first plane of the adjustment marking field,
b) detection of a second adjustment mark of a second plane of the adjustment marking field,
c) determination of a wedge error between the detection means and the substrate holder,
d) compensation for the wedge error determined in step c), wherein the first plane and the second plane are arranged parallel with one another, and wherein the first plane and the second plane have a distance from one another.

An adjustment of the detection means can be carried out or a wedge error can be compensated for with the method, advantageously without a reference wafer or another additional measurement system. This form of calibration can repeatedly take place between wafer-bond processes without the detection means having to move. In addition, the detection means can advantageously remain unmoved and only a change of focus or a shift in the focal range is carried out for the detection of the adjustment marks of different planes of an adjustment marking field.

In a preferred embodiment of the device, the adjustment marking field includes further adjustment marks in a third plane, which is preferably also arranged parallel to the other planes at a certain distance. Particular preferably, the different adjustment marks of different planes are transparent for different wavelengths, so that a further arbitrary adjustment mark in an arbitrary plane of the adjustment marking field can be detected without obstruction by detection means.

In a detection of an adjustment mark and a subsequent detection of an adjustment mark arranged above the latter, the respective known position or the distance between the planes of the adjustment marks can thus be compared with the detected measured value. Since the nature and the structures and the positions of the adjustment marking field are preferably known, the known distance between the adjustment marks can thus be detected and used for detection of optical detection means. With the aid of this known distance, an adjustment and/or correction of detection means can be carried out by a relative movement of the optical detection means with respect to the fixed adjustment marking field of the substrate holder with the aid of the adjustment marks arranged one above the other, without a movement of the substrate holder being necessary. In this way, an optical detection means can be aligned particularly precisely in at least one direction, since the known distance and spatial position between the adjustment marks arranged one above the other is detected and the actual location and angular position of the respective optical detection means can thus be calculated.

The position of the different adjustment marking fields with respect to one another is preferably also known, so that the position of all the adjustment marks of the substrate holder are known. The adjustment marking fields on a substrate holder are preferably positioned in the edge region of the in particular round substrate holder surface. In other words, the adjustment marking fields are clustered in specific areas, in particular in areas in which subsequently alignment markings are typically arranged aligned in a processing operation of the substrate. The adjustment marking fields are thus preferably located on the substrate holder at spatially distributed positions at the points where the substrates to be aligned and to be jointed contain the alignment marks. The location and spatial alignment position of the respective optical detection means relative to the substrate holder can thus be calculated and deviations from the ideal position can be used as correction values for the jointing of an upper substrate to the lower substrate.

The substrate preferably includes a substrate mounting surface. The substrate mounting surface of the substrate holder includes a plurality of in particular uniformly distributed mounting points and/or studs.

In a further embodiment of the substrate holder, the substrate mounting surface has an adjustable form, which can be adjusted depending on the given substrate to be fastened. The position of the respective adjustment marks moreover is known.

In addition, the adjustment marking fields are recessed with respect to the substrate mounting surface and preferably uniformly offset between mounting points, so that the substrate does not come into contact with the adjustment markings.

In a particularly advantageous embodiment of the substrate holder, an adjustment marking and at least one further adjustment marking is located in the traversing region of an optical detection means and a further optical detection means. A more precisely targeted adjustment of the detection means is thus enabled.

An adjustment of the detection means with respect to the substrate holder serves to eliminate or at least reduce an error component, which is the result of a substrate alignment, especially during fusion bonding, due to the position error and/or the angular error of a detection means. By determining the alignment of the detection means with respect to the substrate holder and the corresponding adjustment, errors (parallax errors) can be reduced by orders of magnitude. Furthermore, correction values are used in the alignment of substrates to be jointed, in order to further minimise the alignment error of the substrates with one another.

By means of the adjustment marks arranged one above the other and the additional height information thus provided, an adjustment of the detection means can thus advantageously take place without an additional movement of the substrate holder, since each movement is superimposed with a parasitic movement, which can ultimately increase the alignment error. The measured positions of an adjustment mark and of a further adjustment mark (of another plane) are compared with the actual stored values. From the height difference and the planar offset, a positioning error can be determined, which can be corrected.

In the adjustment marking field, a plurality of adjustment marks are preferably arranged beside one another in the respective plane. At least a first adjustment mark or at least a second adjustment mark of the corresponding plane is thus detected. Furthermore, the adjustment marking field between the planes is preferably constituted transparent for the detection means, so that the adjustment marks arranged one above the other can be detected. It is also conceivable that the adjustment marks of the first plane are arranged offset with respect the adjustment marks of the second plane and the adjustment marking field includes different graduations.

In addition, the detection means can also detect, apart from an adjustment mark of a specific plane, also further adjustment marks of the specific plane, as long as the latter are arranged in the focal range. The same also applies to the further planes. The detection means is preferably constituted such that a plurality of adjustment marks, in particular adjustment marks arranged besides another in the given plane, can be detected. The accuracy of the detection of the wedge error is thus further increased and an adjustment of the detection means can be carried out still more effectively.

In a further embodiment of an adjustment marking field, the individual adjustment marks can be constituted as 3D structures, with defined corners and/or edges, wherein the individual position features are provided with a unique coding (information content), so that a unique assignment of the corners and/or edges and/or steps of the 3D-position information is enabled and a complete spatial mapping of the substrate holder with the adjustment marking field is enabled.

An adjustment mark of the adjustment marking field is preferably detected in a position, in which in a further process an alignment marking of a substrate is positioned. As a consequence of the positioning movements and adjustment and/or correction, neither the substrate holder nor the at least one detected means has to be moved or repositioned. The accuracy of the substrate alignment and then the bonding is increased by the fixed positions.

The detection unit preferably includes focusing means, preferably a lens, which focuses or sharpens the image of the first adjustment mark in the detection. The detection unit or the lens occupies a focal position in which the detection unit can detect a specific focal range. The focal range of a specific focal position of the detection unit or the lens is thus focused and can detect adjustment marks arranged inside the focal range. Only adjustment marks of the respective plane can preferably be detected or identified in a detection, since a focal range in the detection unit always contains only precisely one plane. The difference between the first plane and the second plane is thus preferably greater than the depth of the focal range, preferably at least twice as great or greater.

In particular, liquid lenses with variable curvature and/or fast-switching, resonance-based liquid lenses for the simultaneous imaging of a plurality of focal planes can also be used for focusing. It is also conceivable to change the refractive index of the lens, in order to carry out the focusing and/or refocusing. The listed methods are equivalent or better technical solutions for the classic focusing and/or refocusing by changing the distances in the optical path.

Following the detection of the first adjustment mark of the first plane, the position of the detection means is fixed. The focal range in particular is thus set, so that the detection unit subsequently can preferably only detect adjustment marks inside the set focal range. The second plane is then detected by refocusing at right angles to the first plane of the adjustment marking field on the substrate holder surface of the substrate holder. The detection unit is at least moved until the detection unit can detect the second adjustment mark in the second plane of the adjustment marking field. In this regard, through the focusing movement of the detection unit, the detection unit is advantageously moved by the distance that is required for the focusing. Alignment errors on account of a global repositioning of the detection unit and/or of the fixed substrate holder can thus advantageously be prevented. As a result of the known topography and unequivocal and a priori known x-y-z positions of the individual adjustment marks in the adjustment marking fields on the substrate holder, the angular error of the detection unit at the measured adjustment marks in particular can be calculated by the actual focusing movement and measurement.

For this purpose, the measured values, in particular the measured distance of the different planes of the adjustment marks and a lateral shift and/or rotation, are compared with the stored ideal values, which are the approximations of the respective true values, and the difference is used as a correction value for further measurements.

If further adjustment marks in further planes are arranged between the first plane and the second plane, they can be measured when the focusing movement of the detection unit takes place, so that the movement of the detection unit can be carried out particularly precisely and in a controlled manner. Furthermore, by means of a plurality of detected adjustment marks, the positions of which in the adjustment marking field are known, the relative alignment and the determination of the correction values can take place still more precisely.

The adjustment marks preferably contain information concerning their respective position inside the adjustment marking field. Apart from the position along the adjustment marking field (x-y position), the respective height or the spacing of the planes from one another is also known. If the first adjustment mark is thus detected, it can advantageously be established in which plane the latter is arranged. In particular, when an adjustment marking field has more than two planes with different distances from one another, the alignment and focusing can thus be controlled or regulated more easily, since the respective height information concerning the adjustment marks is detected. For example, in a continuous detection, it can advantageously be established, during the movement or during the detection of the first adjustment mark, which position in which plane or step in the focal range is being detected. If a position between two planes or steps is detected, a plane or step arranged above or below the latter can also advantageously be approached. Furthermore, the location in the x-y position can be detected and controlled.

The device is preferably constituted such that the focal position of the detection unit can be immediately fixed after a detection of the first adjustment mark of the first plane of the adjustment marking field. The fixed focal position of the detection unit thereby establishes the sharply imaged focal range. In this way, the distance of the first plane to the second plane can advantageously be traversed by the movement arrangement and thus focused. The detection unit is also in particular held laterally fixed, so that a movement of the detection means in a z-direction of the distance between the planes is made solely as a result of the adjustment marks being detected. A direct visual control by precisely one detection unit can thus advantageously verify a correction alignment of the detection means with respect to the substrate holder.

In a possible embodiment of the device for adjusting a detection means, provision is made such that the at least one adjustment marking field is arranged on a rear side of the substrate holder facing away from the substrate holder surface. The adjustment marking field can for example be affixed on the rear side or embedded in the substrate holder. In addition, the adjustment marking field can also be formed by the substrate holder itself.

Advantageously, the detection unit can be arranged on the rear side facing away from the substrate holder surface.

In a preferred embodiment of the device for adjusting a detection means, provision is made such that a centre-point of the adjustment marking field is aligned at least partially with a centre-point of the substrate holder surface. By means of the central arrangement of the adjustment marking field, the adjustment of the detection means with respect to the substrate holder can advantageously be carried out precisely. In this embodiment, a linear error component or a rotation of the detection unit relative to the substrate holder can advantageously also be observed.

The adjustment marking field preferably has at least three planes with adjustment marks. Information is provided on the adjustment marks as to which plane the latter are arranged on. Furthermore, a plurality of specific distances can be traversed by the device, so that a plurality of focal positions and distances defined therewith between the detection means and the substrate holder can be set during the adjustment. The distances between the planes can be of equal magnitude. Preferably, however, the planes are arranged at different distances from one another. In this way, a plurality of distances can be flexibly traversed. The adjustments of different focusing planes, following from which the adjustment of specific, different relative distances between the detection means and the substrate holder, can be advantageous with substrates of differing thickness.

In a preferred embodiment of the device for adjusting a detection means, provision is made such that the device includes at least one further adjustment marking field and at least one further detection unit for detecting the at least one further adjustment marking field, wherein the at least one further adjustment marking field is arranged fixed with respect to the substrate holder. The combination of a plurality of measured values in respect of the further adjustment marking field permits a still more precise alignment, since the detection takes place at a plurality of points. For example, displacements and/or rotation errors can thus be detected. The adjustment marking field and the at least one adjustment marking field are preferably arranged offset along the substrate holder. Particularly preferably, the device includes a total of three adjustment marking fields and three detection units, which are each distributed around a centre-point of the substrate holder surface, in particular are arranged offset from one another uniformly in the radial direction.

Adjustment markings can be any objects which can be aligned with one another, such as crosses, circles or squares or propeller-like structures or grid structures, in particular phase grids for the location frequency range. Furthermore, 3D-objects such as pyramids, spheres, steps can be used as adjustment markings.

In a particularly advantageous embodiment of the device, adjustment markings can contain at least in part QR-codes, which in particular describe an absolute, machine-readable position coding (x, y, z position) of the respective adjustment mark, so that complete mapping of the substrate holder and/or the substrate holder surface with the adjustment marking fields is prepared before the use of the substrate holder, in order to serve as reference values for all adjustment processes.

In a further particularly advantageous embodiment, adjustment markings can at least partially contain alphanumeric signs, which in particular describe an absolute, machine-readable position coding (x, y, z positions) of the respective adjustment mark. The alphanumeric signs can preferably also be read by the operator.

The adjustment markings and/or adjustment marking fields are preferably detected by means of electromagnetic radiation of defined wavelength and/or wavelength ranges. These include for example infrared radiation, visible light or ultraviolet radiation. The use of radiation of shorter wavelength, such as EUV (extreme ultraviolet radiation) or x-rays, is also possible.

The adjustment marking field thus includes position-coded and height-coded adjustment markings, which provide unique position information and height information of the substrate holder for the adjustment of the detection means.

In an embodiment, the size or the dimensions of the adjustment marking field in the x-y direction is adapted to the focal range of the in particular optical detection means, so that in each case at least two steps or alignment marking planes can be observed.

The number of steps and the total height of the adjustment marking field is preferably matched to the distance which is to be set. If, for example, a focusing distance of at least 500 μm is to be adjusted, 550 μm height-coded position information is preferably mapped in the adjustment marking field, in order that the distance can definitely be traversed.

The detection preferably takes place with corresponding imaging optical systems, so that the depth of focus can be selected such that it is less than the step height or a layer thickness of an adjustment marking field. The depth of focus (DOF) is the range in the image space of an imaging optical system in which a sufficiently sharp image of a focused object, in particular an alignment marking or an adjustment marking, arises. Conversely, this means that the image plane (an image detection means, sensor) can be displaced in the range of the depth of focus, without the image of an object becoming distinctly unclear.

If the detection of an adjustment mark of the adjustment marking field takes place with a small depth of focus, which is smaller than the step height, is preferably smaller than half the step height, particularly preferably smaller than 0.1 of the step height, the position of the adjustment marking field can be determined unequivocally in particular in the z-direction.

The depth of focus of the detection means amounts to less than 50 μm, preferably less than 20 μm, particularly preferably less than 10 μm, very particularly preferably less than 5 μm, in the optimum case less than 4 μm.

If, on the other hand, the depth of focus is sufficient to sharply image at least two step heights, the positioning uncertainty of the device is increased, because then no unequivocal assignment of a z-height to a step can take place.

In a preferred embodiment of the device, an image detection means or a detection means of the detection unit can be displaced by 0.2 step heights reproducibly without image-side refocusing. This can be used to determine which alignment marking of the adjustment marking field is to be used for the positioning, if the image-side focal plane lies directly on the height of two adjacent steps and both steps appear to be equally sharp. With a small displacement of the image detection means, a decision (also as a computer-implemented, independent process) can be made as to the adjustment markings to be used.

In the detection of the adjustment marking field, only one plane or step is in particular imaged sharply for physical reasons. To this extent, just one step or plane preferably lies in the focal range of the detection unit. Since the adjustment markings of the adjustment marking field are position-coded and spatially-coded, it is possible, from a sharply detected adjustment mark of a plane, to determine position information in particular of the substrate holder in a spatial coordinate system and/or of the detection means. By refocusing the detection means onto a further adjustment marking, the angular error of the detection means is in particular determined through the sizes of the known step height or from the measured planar offset of the adjustment marks, which can be used as a correction value for the alignment of a substrate stack.

The method for the adjustment increases the alignment accuracy in particular by means of the provision of correction values for local angular errors of detection units, which are detected with further adjustment marking fields and corresponding further detection units and can be used for the control and/or regulation of the alignment.

For this purpose, the device for the adjustment and for the alinement of substrates and for the bonding of substrates preferably includes an, in particular software-supported, control unit, by means of which the steps described here are carried out and components are controlled. Closed control loops and controls should be understood to be subsumed under the control unit.

X- and Y-direction or X- and Y-position are understood to mean directions running or positions arranged in an X-Y coordinate system or in an arbitrary Z-plane of the X-Y coordinate system. The Z-direction is arranged orthogonal to the X-Y-directions. The X- and Y-direction corresponds in particular to a lateral direction, preferably along the planes of the justification marking field or along the substrate holder surface. The Z-direction is preferably the direction in which the detection means is moved, when the focal position of the detection unit is fixed in the X-Y-plane.

Position features are calculated or detected from the position and/or location values of the adjustment markings on the substrate holder, in particular by the detection and evaluation of the adjustment marking field.

The adjustment marking field is preferably located in the local vicinity of the alignment markings of the substrate. Particularly preferably, at least one alignment marking of the substrates and the adjustment marking field on the substrate holder is arranged detectable without lateral repositioning of the detection means. An in particular additional alignment marking field can also be arranged on the rear side of the substrate holder, which can be used both for the adjustment of an additional detection means as well as for the alignment of the substrate stack by means of correlated positions.

In a particularly preferred embodiment, at least one alignment marking field is preferably located in the z-direction aligned with the additional adjustment marking of the substrate, preferably on a rear side of the substrate holder.

In a further preferred embodiment of the device, at least one adjustment marking field is preferably located in the z-direction aligned with the centre of the substrate or with the centre-point of the substrate holder surface, in particular on a rear side of the substrate holder.

In a further preferred embodiment of the device, two adjustment marking fields are preferably located aligned in the z-direction with the adjustment markings of the substrate holder, in particular on the rear side of the substrate holder.

In a further preferred embodiment of the device, at least one adjustment marking field is located on the substrate side of the substrate holder or on the side of the substrate holder surface, in the vicinity of the substrate, in a position accessible for the optical detection. This additional detection means can be aligned with the substrate holder in a first process and in a second process used as additional detection means for the alignment of substrates.

A further embodiment of the device contains at least two adjustment marking fields on the substrate side of the substrate holder in the vicinity of the edge of the substrate, in a position accessible for the optical detection. A levelling of the substrate holder can thus advantageously be carried out.

The method for the alignment and the device for the alignment include in particular at least one additional detection unit with the corresponding measurement and/or control system and at least one additional adjustment marking field and/or alignment marking field, wherein the alignment accuracy can be further increased by additional measurement values and correlations with at least one of the measured values of the additional detection units. In addition, the respective correction values from the measurements are used.

In a further method, after the adjustment of the detection means using the corrections, the direct observability of an adjustment mark and thus a real-time measurement and control during the alignment is enabled by the correlation of at least one of the measured additional alignment markings, in particular on the contact surfaces of a first substrate and/or a second substrate with at least one adjustment mark of the adjustment marking field, which is also freely accessible and visible in the alignment of the substrates. The alignment accuracy of the substrates is thus additionally increased.

In a further embodiment of the device, at least one further adjustment marking field is positioned on the substrate side of a substrate holder close to the peripheral edge of the substrate in a position which is permanently accessible for a further detection unit. Particularly preferably, a surface of the adjustment marking field is located in the same plane as the surface of the substrate fastened on the substrate holder and to be bonded.

By means of the 3D position features additionally added on the substrate holder, which can be unequivocally correlated with the position features on the substrate, a direct observation of the alignment markings on the substrate can be replaced by a direct observation of the adjustment markings on the substrate holder. This has the advantage that the observable part of the substrate holder can almost always be arranged in the field of vision or in a detection area of a detection unit. By means of the 3D position information and correction of the angular position of the detection means, the alignment of the substrates with one another can be carried out with increased accuracy.

The detection area of a detection unit amounts to less than 3 mm×3 mm, preferably less than 2 mm×2 mm, particularly preferably less than 1 mm×1 mm.

An active feedback of the data of the positioning and position correction increases the accuracy compared to controlled positioning in the prior art, since the possibility of a control of the actual state of the position is provided in closed control loops.

A correlation of the alignment markings of a first substrate and/or a second substrate on the respective contact surfaces of the substrates is produced with at least one adjustment mark of the adjustment marking field. The one adjustment mark of the adjustment marking field can be detected during the alignment, in particular directly, by the detection unit.

The direct detectability or observability of the at least one additional adjustment mark of an additional adjustment marking field enables a real-time measurement of the 3D position of the substrate holder or of the detection means. The same device can be used in the alignment of substrates or in the bonding, in particular fusion bonding, of substrates for reduction of alignment errors. The alignment accuracy is increased, because position uncertainties disappear with the detection of the adjustment marking field and by the provision of correction values and the calculated height information, as a result of which error propagation is reduced. As a result of this measure, the alignment accuracy is improved by the reduction in the number of necessary feed movements and controlled height displacements during bonding.

The detection unit for detecting the adjustment marking field is in particular part of an optical system for detecting the adjustment marking field and, according to an advantageous embodiment, contains beam-shaping and/or deflection elements such as mirrors, lenses, prisms, radiation sources in particular for the Köhler illumination and image detection means such as cameras (CMOS sensors, or CCD, or area or line or point detection means such as a phototransistor) and movement means for focusing as well as evaluation means for controlling the optical system.

In a further embodiment of the device, the optical system can be used in combination with a rotation system for the substrate positioning according to the principle of the turn-round adjustment (see in this regard Hansen, Friedrich: Justierung, VEB Verlag Technik, 1964, para. 6.2.4, Umschlagmethode). Accordingly, in the turn-round adjustment at least one measurement is carried out in a defined position of the respective substrate holder and at least one measurement in the oppositely orientated, turned round position, rotated through 180 degrees. The measurement result thus obtained is in particular free from eccentricity errors. The substrate holder can preferably be rotated and the detection means remain fixed in position apart from focusing.

A development of the device for the adjustment can be used as a device for the alignment of substrates.

Furthermore, a device can contain a system for the production of pre-bonds. For the jointing of substrates, pins and/or adjustable nozzles can be used for the initiation of the fusion bond.

In particular, the adjustable nozzles can be height-adjustable, so that the relative position with respect to the substrate rear side can be changed and the volume flow of the nozzle can be regulated adjustably. The alignment of the latter can advantageously take place with the aid of adjustment markings arranged one above the other.

Furthermore, a device preferably contains movement arrangements with drive systems, guidance systems, restraints and measurement systems, in order to move, position and precisely align at least the detection unit and the substrate holder and therefore the substrate to be aligned.

The movement arrangements can produce any movement as a result of individual movements, so that the movement arrangements can preferably contain rapid rough positioning devices not meeting the accuracy requirements as well as fine positioning devices operating precisely.

By a rough positioning device, a positioning device is understood if the approach and/or repetition accuracy deviates from the setpoint value by more than 0.1%, preferably more than 0.05%, particularly preferably more than 0.01%, relative to the total travel path or the rotation range, in the case of rotating rotation drives a complete revolution of 360 degrees.

For example, an approach accuracy of 600 mm*0.01%, i.e. more than 60 μm, thus results as a residual uncertainty with a rough positioning device with a travel path of over 600 mm (twice the substrate diameter).

In another embodiment of the rough positioning, the residual uncertainty of the approach or repetition accuracy is less than 100 μm, preferably less than 50 μm, particularly preferably less than 10 μm. Thermal disturbance variables should also be taken into account.

A rough positioning device performs the positioning task with sufficient accuracy only if the deviation in the traversing range of an assigned fine positioning device lies between the actually reached present position and the setpoint value of the position.

An alternative rough positioning device performs the positioning task with sufficient accuracy only if the deviation in half the traversing range of an assigned fine positioning device lies between the actually reached current position and the setpoint value of the position.

A positioning device is understood to mean a fine positioning device if the residual uncertainty of the approach and/or repetition accuracy does not exceed a setpoint value of less than 500 ppb, preferably less than 100 ppb, more preferably 1 ppb related to the whole travel path or rotation range.

A fine positioning device will preferably compensate for an absolute positioning error of less than 5 μm, preferably less than 1 μm.

The alignment of the substrates with one another can take place in all six degrees of freedom of movement: three translations according to the coordinate directions x, y and z and three rotations around the coordinate directions. The movements can be carried out in any direction and orientation.

Robots for the substrate handling are subsumed as movement arrangements. The restraints can be structurally integrated or functionally integrated into the movement arrangements.

Furthermore, the device for the adjustment of the detection unit preferably contains control systems and/or evaluation systems, in particular computers, in order to perform the described steps, in particular to perform movement sequences, to carry out corrections, to analyse and store operational states of the device.

Methods are preferably drawn up as formulas and constituted in machine-readable form. Formulas are optimised value collections of parameters, which are in a functional or process-related connection. The use of formulas makes it possible to guarantee reproducibility of production operations.

According to an advantageous embodiment, a device for the adjustment further contains supply systems and auxiliary systems and/or supplementary systems (compressed air, vacuum, electrical energy, liquids such as hydraulics, coolants, heating media, means and/or devices for temperature stabilisation, electromagnetic shielding).

Furthermore, the device for the alignment can include a frame, cladding, vibration-suppressing or -damping or -eliminating active or passive subsystems.

Furthermore, a device for the alignment preferably contains at least one measurement system, preferably with measurement units for each movement axis, which can be constituted in particular as path measurement systems and/or angle measurement systems. The measurement system preferably includes at least one detection unit or an additional detection unit.

Tactile, i.e. touching, or non-tactile measurement systems can be used. The measurement standards, the unit of measurement, can be present as a physical object, in particular as a scale, or be present implicitly in the measurement process such as the wavelength of the radiation used.

To achieve the alignment accuracy, at least one of the following measurement systems can be selected and used. Measurement systems implement measurement methods.

inductive methods and/or
capacitive methods and/or
resistive methods and/or comparison methods, in particular optical image recognition methods, detection of position marks and/or QR codes and/or incremental or absolute methods (with in particular glass standards as a scale, or interferometer, in particular laser interferometer, or with magnetic standards) and/or runtime measurements (doppler methods, time-of-flight methods) or other time detection methods and/or triangulation methods, in particular laser triangulation and/or autofocus methods and/or intensity measurement methods and fibre optic range finders can in particular be used.

The listed measurements methods can also be used in the device for the adjustment, in order in particular to detect and to correct not only the local relative position and/or the locations of the detection means relative to the substrate holder, but also to carry out an absolute position measurement in the device.

Furthermore, a particularly preferred embodiment of the device for the alignment contains at least one measurement system, which detects the X-Y-Z and/or alignment position and/or angular position of at least one of the substrates and/or one of the substrates holders in relation to a defined reference, in particular to the frame. The measurement system includes at least one adjusted detection unit.

3D positions preferably of the substrate holder with a corrected angular position are determined with the measurement system or with the detection unit of the measurement system, so that the height information and the angular position can be determined for the planar position data from the measurement. In addition, at least one adjustment marking field including steps and/or layers with unique position markings is detected.

A frame can be understood to be a part in particular including natural hard stone or mineral cast or spheroidal graphite cast iron or hydraulically bound concrete, which in particular is constituted vibration-damped and/or vibration-isolated and/or with vibration-absorption.

By affixing the detection units on the substrate holder and affixing of the adjustment marking field for example on the frame, a reversal of the idea can also advantageously be implemented. In this case, the detection unit is moved with the substrate holder and the adjustment marking field is fixed on the frame.

An order that the detection, evaluation and control can be carried out at any point in time, and particular permanently, the adjustment marks of the adjustment marking field according to an advantageous embodiment are distributed on a larger area of the respective plane than the field of view of an image detection system of the detection units, in order to supply the control unit (and/or regulation unit), in particular continuously, with measurement values. The adjustment marks of the adjustment marking field are laid out, however, at each position of the field of view of the image detection system, such that the height information can be detected from the adjustment marking field and/or the extended planar position information. In other words, the spatial position of the detection means can be detected and the correction of the angular position can be determined at any lateral position of the substrate holder by the arrangement of the adjustment markings of the adjustment marking field. Since the relative position of the in particular detection means is present as 3D position information, a more precise spatial alignment of the substrates fastened thereon with respect to one another can be carried out.

For an X-Y-Z position determination, use can be made in the device for the alignment, in addition to the at least one detection means, of at least one three-beam interferometer with a correspondingly formed, in particular monolithic, reflector for the detection of the X-Y-Z position and/or location determination of the substrate holder. Structurally, the detection means and the interferometer are integrated for this purpose into an assembly, so that the detection means and the interferometer cannot carry out any movements independent of one another.

A further advantageous embodiment of a device can in particular, in addition to the device for the detection of adjustment marks of adjustment marking field, also contain measurement means, for example a prismatic, monolithic reflector, in which measurements are carried out with a plurality of in particular three-beam interferometers. The error propagation can thus be eliminated by averaging, difference formation and measurement series formation and the alignment accuracy can be further increased. In other words, control systems can be used for the trajectory of the movement with sufficiently fast position measurements, so the position errors of the substrate holder can be further reduced.

The substrate holder, formed in particular from a monolithic block, of the device for the alignment and/or the adjustment preferably includes at least two of the following functions:

substrate fastening with vacuum (vacuum tracks, connections) and/or with electrostatic means, shape compensation for the deformation of the substrate by means of mechanical and/or hydraulic and/or piezoelectronic and/or pyroelectrical and/or electrothermal actuation elements, position and/or location determination (measurement standards, reflection surfaces and/or prisms, in particular the reflectors for interferometry, register marks and/or register mark fields, planar-constituted measurement standards for planes, volume standards, in particular steps, layer systems of known layer heights with adjustment markings distributed in planes)

movement (guide tracks)

Movement arrangements, which are not used for the fine adjustment, are constituted in particular as robot systems, preferably with incremental linear encoders. The accuracy of the movement arrangements for auxiliary movements is decoupled from the accuracy for the alignment of the substrate stack, so that the auxiliary movements are carried out with lower repetition accuracy of less than 1 mm, preferably less than 500 μm, particularly preferably less than 150 μm.

The control and/or regulation of the movement arrangements of the device for the alignment for the (lateral) alignment (fine adjustment) is carried out in particular on the basis of the detected X-Y-Z positions and/or alignment positions. In addition, the additional alignment marks of the substrate are correlated with the adjustments mark of the adjustment marking system assigned uniquely thereto in the field of view on the surface of the substrate holder. The height information and the angular position as well as their correction is calculated from the adjustment marking of the adjustment marking field. This is given by an X-Y-Z position and the spatial orientation, which can be observed in particular continuously during the feed movement of the alignment and in the setting of the distance for the bonding and in particular can be used for the error correction of the feed movement in real time.

The accuracy of the movement arrangements is less than 500 nm, preferably less than 100 nm, particularly preferably less than 50 nm, very particularly preferably less than 10 nm, more preferably less than 5 nm, most preferably less than 1 nm. In a particularly preferred embodiment of the device, the error of the alignment accuracy of the device amounts to less than 20% of the permitted maximum alignment error, preferably less than 10%, most preferably less than 1%. In other words, the permitted alignment error of the substrates amounts for example to 10 nm, then the position error amounts to at most 20% of the value, i.e. 2 nm.

In a particularly preferred embodiment of the substrate holder, the substrate holder can exist as a non-monolithic body including a plurality of parts. The substrate mounting surface contains at least one adjustment marking field with the adjustment markings and the, in particular distributed, point-like mounts for the mounting of a substrate. The substrate mounting surface forms a part of an insert, which is a reproducibly elastically deformable body. The insert is in particular incorporated statically defined in a base body. The substrate mounting surface is connected fluidically by correspondingly configured channels and nozzles and feed lines to an, in particular, vacuum whose under-pressure can also be converted into an excess pressure.

The insert is in particular clamped in the base body. At least the rear side of the insert facing away from the substrate mounting surface is incorporated isolated in particular gas-tight in the base body of the substrate holder, so that the insert can be deformed reproducibly by means of vacuum or excess pressure.

The fluidic connection of the space of the base body of the substrate holder with the rear side of the insert can be subjected independently to a regulated excess pressure or under-pressure and the deformation of the insert can thus be brought about.

An exemplary embodiment of a method for the adjustment of a detection means takes place in particular with the following sequence with in particular the following steps.

First process step: at least one detection means is moved into the expected position of an alignment marking of the substrate to be aligned. This positioning is bound up with a positioning uncertainty.

Second process step: the substrates holder is fastened, so that movements of the substrate holder cannot take place.

Third process step: the detection means focuses on an adjustment marking of an adjustment marking field and detects the adjustment marking.

Fourth process step: from the knowledge store and/or from a database, the stored position of the adjustment marking is retrieved and correlated with the detected measurement value of the detection means. The spatial position, in particular the absolute position, of the detected adjustment marking is thus stored.

Fifth process step: the detection means focuses on a further adjustment marking of a second plane of the adjustment marking. Only a focusing movement preferably takes place in the z-direction in the device.

Sixth process step: the further adjustment marking is detected and the position and the location of the further adjustment marking is calculated.

Seventh Process step: the relative position and/or the angular position of the detection means in respect of the local normal direction of the substrate holder is calculated in particular from the height known from the memory and also from the calculated z-focusing height and also from an in particular x-y lateral displacement of the further adjustment marking. This value can be used as a correction value for the sequence process.

In an advantageous embodiment, the sought adjustment markings can be detected in a radius less than 3 mm, preferably less than 2 mm, particular preferably less than 1 mm, very particularly preferably less than 500 μm, still more preferably less than 250 μm in the vicinity of the optical axis of the respective lens of the detection units.

By means of a measurement system with at least one detection unit for detecting adjustment marks of an adjustment marking field (in particular a measuring microscope with a lens), a first adjustment mark of a first plane and thus an X-Y-Z position and/or alignment position of the substrate holder is detected. The substrate holder is held fixed and the position or the positions of the additional alignment marking of the lower substrate is correlated with the detected position. In order to detect the position of the substrate holder, use is made of the adjustment marking field arranged fixed with respect to the substrate holder.

A step of the adjustment marking field is detected preferably focused, which lies close to the free surface of the adjustment marking field and adjustment markings can be observed in the entire depth of the adjustment marking field.

In this focused position, the focal position and thus the focal range (in particular of the lens) of the detection unit for the detection of the adjustment marking field is fixed. Furthermore, the detection unit is held in particular locally fixed or immovable.

During the refocusing, at least one adjustment mark of a first plane is detected in the initial position and at least one adjustment mark of a second plane of the adjustment marking field is detected in the target position.

The position of the substrate holder is corrected at least in the lateral plane by means of the measured position error and/or angular error. The detection means is moved in such a way that the corresponding at least one second adjustment mark of the second plane is focused, or lies in the focal range of the detection unit. In this way, it can be ensured by a visual control that the distance between the first plane and the second plane has been approached sufficiently precisely.

The repositioning of the substrate holder can be dispensed with and alignment errors can be prevented, since correction values can be used. Height information is provided by the adjustment marking field. During the alignment of the substrates with one another, corrections can be carried out to their relative position to one another, if the alignment error exceeds a fixed limiting value. For these corrections, the method for the adjustment delivers a correction value.

The alignment errors at which corrections for displacements can be used are less than 500 μm, preferably less than 100 μm, particularly preferably less than 100 nm, very particular preferably less than 10 nm, still more preferably less than 5 nm, most preferably less than 1 nm.

The alignment errors at which corrections for rotations can be used are less than 50 microradians, preferably less than 10 microradians, particular preferably less than 5 microradians, very particularly preferably less than 1 microradian, still more preferably less than 0.1 microradians, most preferably less than 0.05 microradians. In other words, the method permits the different planes of an adjustment marking field to be measured according to a sequence of defined relative movements, in order to derive therefrom the relative position and/or the alignment position of the two measured objects with respect to one another, in order thus to produce correction values, which in turn increases the alignment accuracy of the substrate stack. If the observed planes of the adjustment marking field are not normal to the z-axis of at least of one of the detection means, each relative movement causes a displacement in the x-y plane and/or angular error (yaw error and/or pitch error and/or roll error), which can be detected and can be correspondingly corrected. A substrate holder with an integrated adjustment marking field can be understood in particular as an independent device. The substrate holder preferably contains the adjustment marks of at least one adjustment marking field close to the substrate mounting surface of the substrate holder, recessed in such a way that no contact between the substrate and the adjustment marks occurs when use is made of the substrate holder. In other words, the adjustment to marks of the adjustment marking field and the substrate do not contact one another at any time when the substrate is placed on the substrate holder surface. The use of a stud sample holder with integrated adjustment marking fields is particularly advantageous.

In an advantageous embodiment of the substrate holder, the individual adjustment marks of the adjustment marking field can be positioned on the substrate holder in such a way that they are in the vicinity of the alignment marks on the substrate. The purpose of the positioning is to calibrate and/or to adjust the device without a substrate with the detection means, in particular to measure an angle error of the individual detection means, in order to be able to use calibrated values of the device in the alignment. After the calibration, the detection means are preferably locked, held fixed, in position. When the substrate holder is used for the alignment of substrates, the adjustment marks of the substrates can thus be detected without readjustment movements of the detection means. In other words, the in particular z-axes of the adjustment markings of the adjustment mark field coincide with the z-axes of the alignment marks of the substrates locally in the field of view of the individual alignment means. The calibrated detection means and the substrate holder can thus be used without repositioning for the alignment of the substrates.

The terms axes coincide or congruency or parallelism or normality are used in this publication as terms of tolerance-affected magnitudes, so that in particular the tolerances apply as length dimensions or angular dimensions not tolerated according to ISO 2768, unless the tolerances are explicitly stated.

BRIEF DESCRIPTION OF THE DRAWINGS

Further advantages, features and details of the invention emerge from the following description of preferred examples of embodiment and with the aid of the drawings. The latter show diagrammatically.

DETAILED DESCRIPTION OF THE DRAWINGS

Advantages and features of the invention are shown in the figures. The represented embodiments are provided with reference numbers. The individual components or features with the same function or a function having the same effect are denoted by the same reference numbers.

Figure 1:
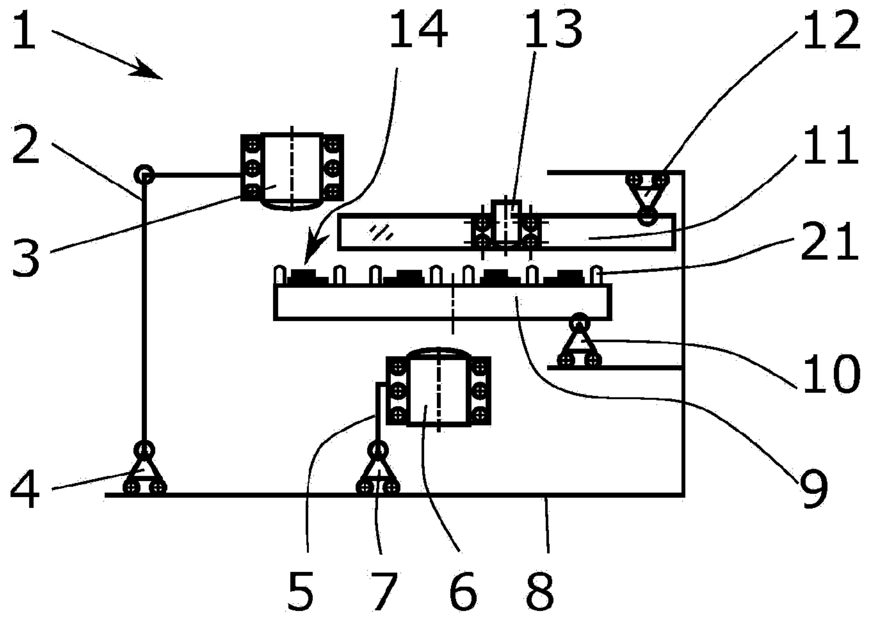
FIG. 1 is a cross-sectional view of an embodiment of a device for the adjustment of a detection means.

A diagrammatic functional representation of the device for the adjustment of a detection means is shown in FIG. 1. The device is part of an alignment system 1 for the alignment or the processing of substrates. Alignment system 1 can align substrates (not shown) with one another and bond the latter together at least partially and/or temporarily (so-called pre-bond).

Alignment system 1 contains a first substrate holder 9, on which a first substrate can be loaded and fixed on a substrate holder surface. Furthermore, alignment system 1 contains a second substrate holder 11, on which a second substrate can be loaded and fixed.

The first, in particular lower, substrate holder 9 is arranged on a first movement arrangement 10 for holding and implementing feed movements and adjustment movements (alignment) of first substrate holder 9. The second, in particular upper, substrate holder 11 is arranged on a second movement arrangement 12 for holding and implementing feed movements and adjustment movements (alignment) of second substrate holder 11. Movement arrangements 10, 12 are fixed to a common, solid table or frame 8, in order to reduce/minimise vibrations of the functional components. The frame can in particular contain active vibration damping.

For the detection of alignment markings on the substrates (not shown), optical systems 2, 5 of alignment system 1 can also be used. By means of detection means 3, 6 (in particular lenses), alignment markings on the substrate or the substrate holder can thus also be detected. Optical system 2 is preferably designed to detect adjustment marks of an adjustment marking field.

Optical system 2, in particular detection means 3, can be focused on a focal plane or focal position. At least one adjustment mark can be detected within a focal range 19. The horizontal distance (z-direction) between the adjustment marks of the different planes of an adjustment marking field are known and can also be read out with the aid of an information content of an adjustment marking (e.g. QR code). Movements of optical system 2, in particular in the X-, Y- and Z-direction, are carried out by means of a positioning device 4 for positioning optical system 2. Positioning device 4 can be fixed in particular on solid frame 8.

Insofar as it concerns an optical measurement system 2, the positioning device 4 can carry out focusing in respect of an adjustment mark of a first plane 18 of an adjustment marking field 14 by a movement of detection device 3 in the Z-direction. A positioning in the X-Y direction is also conceivable, wherein in particular one fixing takes place, preferably to the table/frame, during the adjustment.

Furthermore, in the represented embodiment of alignment system 1 with detection unit 3, an adjustment mark 15 of an adjustment marking field 14 can be detected in the x-y-z position. After refocusing onto a further plane (distance between the planes of adjustment marking field 14 are known), the actual spatial angular position is detected from the known height of the planes or from the known distance between the planes of an adjustment marking field and from the parasitic, lateral movement of detection means 3 with a fixed substrate holder 9. The wedge error of optics 3 and substrate holder 9 or mounting surface of substrate holder 9 is thus determined. Optics 3 can thus advantageously be adjusted or calibrated with the aid of the adjustment marking field on substrate holder 9. In addition, the position of detection means 3 can be calculated. The position can be used as a correction factor for the reduction of the alignment error of the substrate stack. A substrate (not represented) is mounted in particular on substrate holder surface 20 including a plurality of individual surfaces.

Substrate mounting surface 20 preferably includes a multiplicity of studs 21.

In the represented embodiment of alignment system 1, in particular the X-Y position and/or location (in particular also the rotation position) and/or the height position of lower substrate holder 9 can be detected with especially great accuracy with measurement system 5 or detection unit 6. For the initiation of a fusion bond, at least the upper substrate can be pretensioned with substrate pretensioning device 13. The pretensioning can take place by means of mechanical pretensioning with a pretensioning element, a so-called bond pin. In a further embodiment of the substrate pretensioning device, the pretensioning of the substrate can take place with a fluid, in particular with a gas from a nozzle, in particular from a mobile nozzle.

With embodiments of the device which are not represented, but are preferred, the following process steps listed by way of example can be carried out:

The first substrate is fastened on the substrate holder surface of first substrate holder 9. As a fastening, use is made in particular of a mechanical and/or electrostatic clamping, pressing force, which is produced on account of a pressure difference between the environment in normal atmosphere and under-pressure on first substrates holder 9, also known as a vacuum fixing. The fastening takes place in particular in such a way that the first substrate does not experience any imprecise or undesired movement relative to the first substrate holder 9 during the entire process. A thermal heat expansion can in particular be prevented or reduced, insofar as first substrate holder 9 and the first substrate each have a corresponding, preferably linearly correspondingly running, heat expansion coefficient, wherein the difference in the heat expansion coefficients and/or the linear course of the heat expansion coefficients is preferably less than 5%, preferably less than 3%, particularly preferably less than 1%.

Preferably, the system is operated in a temperature-stabilised environment, especially in a clean room, in which a temperature fluctuation amounts to less than 0.5 Kelvin, preferably less than 0.1 Kelvin, particularly preferably in less than 0.05 Kelvin, most preferably less than 0.01 Kelvin during an adjustment and alignment cycle.

The fixed first substrate and in particular an insert of substrate holder 9 can be understood to be quasi-monolithic bodies for the performance of movements of the first substrate, which permit no relative movements with respect to one another.

This substrate fastening can take place in a form-fit and/or preferably friction-locked manner. The effect of the quasi-monolithic connection is that the influences, which can be brought about by a displacement and/or rotation and/or deformation between the substrate holder and the substrate are at least reduced, preferably at least reduced by an order of magnitude, particularly preferably eliminated. The alignment error can thus by further reduced together with the adjustment of detection means 3 with respect to the substrate holder.

With form-fit or friction-lock, the substrate can be connected to substrate holder 9 in such a way that, in particular, the difference of a thermal expansion can be eliminated. Furthermore, the independent deformation of the substrate can be reduced, eliminated and/or corrected with the substrate holder. In addition to these measures, at least one detection means can be located in a defined position and angular position with respect to the substrate holder, in particular to the adjustment markings of the adjustment marking field of the substrate holder surface, so that on the one hand the slow thermal relative movements can be detected and corrected, and on the other hand, by means of the preliminary adjustment of the position and angular position of the detection means, the positioning errors of the substrate holder with respect to the detection means can at least be reduced.

In an embodiment, lower substrate holder 9 and also upper substrate holder 11 can contain additional, passively and/or actively operated deformation elements and/or intermediate plates, also called inserts, in order to minimise the mechanical and/or thermal properties of the substrates for the reduction of the residual error of the alignment after the jointing.

First substrate holder 9 can be located in an optical path of detection unit 3 during the detection of a first adjustment mark 15 of a first adjustment marking field 14.

A detection unit, or a detection means equivalent thereto, is preferably arranged aligned or at right angles to a defined adjustment mark of an adjustment marking field 14, so that a detection of an alignment marking of a substrate to be bonded in the same x-y position does not require repositioning of the substrate holder and/or the detection means. The accuracy of the alignment of the substrate stack is thus increased by reducing the required movements and detection and adjustment of positions.

The lower substrate holder includes adjustment marks 15 of adjustment marking field 14. With the aid of adjustment marks 15, the X-Y-Z position and the alignment position of respective adjustment mark 15 inside the adjustment marking field can also be determined. By detecting a further adjustment mark 15 in another plane of the same adjustment marking field 14, the wedge error or the angular position of substrate holder 9 relative to detection means 3 can be detected.

In addition, it is also conceivable that, instead of a relative movement (or refocusing) of detection means 3, substrate holder 9 performs a relative movement in the Z-direction and the detection means is held fixed. From this adjustment process, a similar correction value of a relative position can be calculated, which in particular determines a parasitic movement of the substrate holder with respect to the detection means held fixed.

Detection unit 6 can also be used to detect adjustment marks 15 on different planes of adjustment marking field 14, if the substrate holder is transparent for detection unit 6.

The measurement values (X-Y position and/or alignment position of the first substrate and X-Y-Z position and/or alignment position of first substrate holder 9 or of the first substrate) can be correlated with one another after using the adjustment/correction, so that the X-Y-Z position of substrate holder 9 and/or the detection means can be recovered reproducibly. The substrate fastened on substrate holder 9 can be moved in a controlled manner for the alignment and the adjustment of the bonding distance, without adjustment markings 15 of substrate holder 9 or the alignment markings of a substrate being able to be observed directly.

By assigning the position of the substrate to the spatial position and/or location of the substrate holder 9 or detection means 3, an alignment can be carried out without directly observing the X-Y-Z positions and/or alignment position and/or relative angular positions of the respective substrate during the alignment and/or contacting. The determined correction values increase the positioning accuracy by reducing the positioning uncertainties before or during the alignment and contacting of a first substrate with the second substrate. Furthermore, the distance between the substrates can be adjusted in defined manner and/or minimised during the alignment, for which additional adjustment marking fields especially on the rear side of the substrate holder facing away from the substrate mounting surface can be used.

In particular, a repetition accuracy of the positioning (measured as a relative average alignment error between the two substrates), also known as reverse play, of less than 500 nm, preferably less than 100 nm, particularly preferably less than 30 nm, very particularly preferably less than 10 nm, still more preferably less than 5 nm, most preferably less than 1 nm, is achieved.

The reverse play results from the movements of the movement arrangements, only the place of detection varies, so that the measurement magnitude exists as a relative alignment error. Through the local measurement of the incorrect position of detection means 3, the process reduces the local positioning inaccuracy, which consequently further reduces the local alignment error.

To further increase the alignment accuracy, a first detection unit 3 can be operated time-synchronised with at least one further additional detection unit 6. The time difference of the detections of the measured values amounts to less than 3 seconds, preferably less than 1 second, particularly preferably less than 500 milliseconds, very particular preferably less than 100 milliseconds, still more preferably less than 10 milliseconds, most preferably less than 1 millisecond, in the ideal case is simultaneous. This is particularly advantageous because the effect of interfering influences such as mechanical vibrations can be eliminated. Mechanical vibrations are propagated, amongst other things, with mechanical vibration with several thousand m/s in the materials. If a control and the detection means operate faster than the propagation speed of the mechanical vibration, an interference is reduced or eliminated.

If detection unit 3 and detection unit 6 for detecting adjustment marking field 14 and a further adjustment marking field on the rear side of the substrate holder synchronised with one another (in particular by simultaneous triggering of the detection and the equalisation of the detection time and/or identical integration time for camera systems), some interfering influences can be reduced, in the optimum case eliminated, since the detection should take place at a point in time at which the interfering influences have as small an effect as possible on the detection accuracy.

In a preferred embodiment of the method and the device for the adjustment of a detection means and in the device for the adjustment, the detection will take place in a synchronised manner with known, in particular periodic interfering influences, in particular at the vertex of the vibration. For this purpose, vibration sensors (acceleration sensors, interferometers, vibrosensors) can preferably be fitted beforehand at points of the device of relevance for the accuracy. The interfering influences are picked up by these vibration sensors and are taken into account or rectified for the elimination by calculation. In a further embodiment, the vibration sensors can be fixedly installed at the characteristic points of the system.

For the adjustment of the detection means or as the case may be a plurality of detection means, it is advantageous if adjustment marking field 14 is measured completely and the setpoint values are provided in a memory for comparison or difference formation. The setpoint value contains in particular image data of the adjustment marks of adjustment marking field 14 of first substrate holder 9 and/or control parameters such as path curves for optimum approaching of the spatial position and/or in particular machine-readable values for the drives, in particular for the focusing of detection means 3. In other words, the position of the individual adjustment marks of an adjustment marking field and further adjustment marks of a further adjustment marking field is known and stored.

Figure 2A:
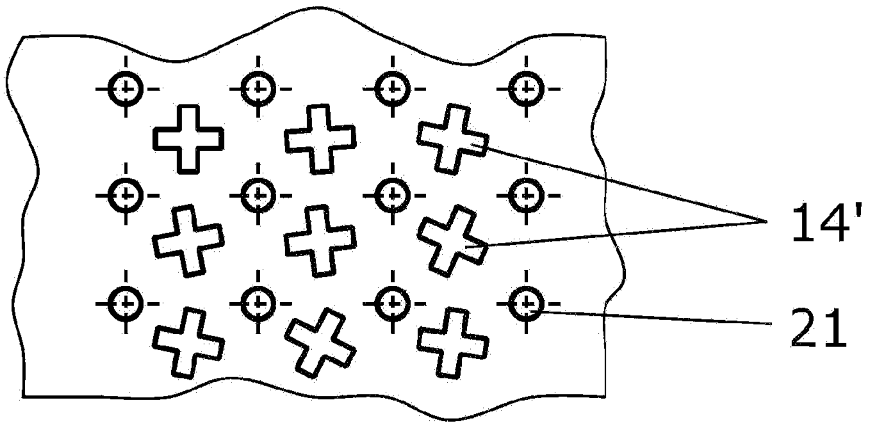
FIG. 2*a* is a plan view of an exemplary arrangement of the adjustment marks or the adjustment marking fields between elevations of the substrate holder.

FIG. 2*a* shows a plurality of adjustment marking fields in a diagrammatic, greatly enlarged plan view with in each case a visible adjustment mark 15 or adjustment marking 15 selected by way of example.

Individual adjustment marks 15 represent symbolically and diagrammatically an absolute, unequivocal coding of the position and the location of each individual adjustment mark or adjustment marking 15. Individual adjustment marks or adjustment markings 15 can be present in different planes of the adjustment marking field. Since the x-y-z position of each alignment marking 15 is known, it suffices for a position detection of the substrate holder (not represented) that a coded adjustment mark 15 or adjustment marking 15 is detected. After that, refocusing (or a relative movement in the z-direction with the same focusing) on a further adjustment mark 15 or adjustment marking of the same adjustment marking field can take place, so that the angular position and/or the wedge error of the detection means relative to the substrate holder can be determined. The adjustment of the detection means can thus advantageously take place with the aid of an adjustment marking field.

Figure 2B:
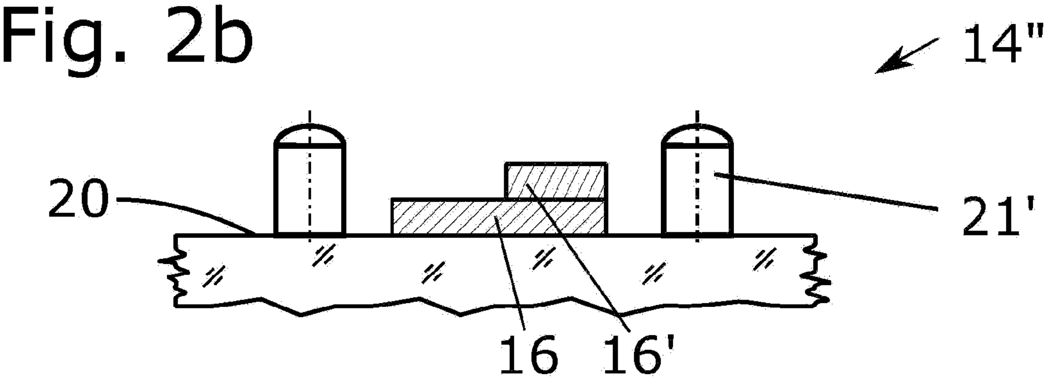
FIG. 2*b* is a cross-sectional view of an embodiment of an adjustment marking field.

FIG. 2*b* shows an adjustment marking field 14'' with different layers 16, 16' or steps. The adjustment marks of a step are thus arranged in a plane and have a specific and known distance from the adjustment marks of another step or plane of adjustment marking field 14''. In the represented embodiment, adjustment marking field 14'' is arranged between the elevations or studs 21'.

Adjustment marking field 14'' is arranged fixed relative to the substrate holder or substrate holder surface 20. Mounting surface elevations 21' (for mounting the substrate) are higher than the highest point of adjustment marking field 14'' or have a greater distance from the substrate holder mounting surface. The adjustment marking fields are thus recessed with respect to the substrate holder mounting surface (mounting surfaces of the elevations). The adjustment marks or adjustment markings (of the uppermost plane of the respective adjustment marking field) advantageously do not, therefore, come into contact with the substrate.

The effect of the reduced mounting area of studs 21' is that a substrate does not lie on its full surface, so that possibly present particles on the rear side of a substrate do not cause distortions.

A cross contamination of the substrate or the substrate holder is advantageously minimised.

The adjustment marking field is arranged fixed in respect of the substrate holder. In particular, the adjustment marks on different planes or on a plurality of steps and/or layers 16, 16' can therefore lie and be detected successively in the field of view or focal range of detection unit 3. By means of the known step heights or the known distances between the planes and known positions of the adjustment markings, the latter can be used to determine the angular error of the refocusing detection means.

It is possible for a modified process to be used for the determination of correction values from the location and angular position of the detection means, which measures layers 16 and 16' of adjustment marking field 14" in particular with the following steps, with the following sequence:

In the first process step, the substrate holder is raised by the substrate thickness in a z-direction. In a second process step, at least one detection means 3 is moved into the expected x-y position of the alignment mark of the substrate and held fixed in the x-y. In a third process step, at least one detection means is focused on an adjustment marking of an adjustment marking field 14 of the substrate holder and the adjustment marking in the x-y position and a rotation about the Z-axis is detected. In a fourth process step, the substrate holder is moved in the Z-direction away from the detection means held fixed, so a further adjustment mark of another plane or layer 16 or 16' can be detected. In a fifth process step, an adjustment marking of corresponding layer 16 or 16' and the relative displacement is determined from the movement of the substrate holder and the parasitic movements and, compared with the ideal values, the correction value is calculated. A correction value for the angulation of the relative position between the substrate holder and the detection means is calculated. The detection means is then adjusted or the wedge error is compensated for.

The distance between the planes amounts to between 1 μm and 300 μm, preferably between 5 μm and 200 μm, more preferably between 10 μm and 100 μm, particularly preferably between 25 μm and 75 μm, most preferably between 48 μm and 52 μm. For example, the distance between the planes amounts to 50.00 μm.

In addition, it is advantageous if the respective additional adjustment marks 15, 15' have detectable position information. With a plurality of adjustment marking fields between the elevations/studs 21, 21', it is possible to determine the angular position or the wedge error between the substrate holder and the detection means at correspondingly many points, without the detection means having to be moved in the x-y direction. Since the position of the respective detected adjustment marks 15, 15' with respect to adjustment marks 15 of the adjustment marking field is known, this position and location information can be used for the optimisation of movements or for the adjustment of distances, in particular bond gaps. Not only the position of the detected adjustment marks 15, 15' with respect to adjustment marks 15, 15' of the same plane is preferably known, but also the position of the respective plane of detected adjustment marks 15, 15' with respect to the other planes of the adjustment marking field.

Figure 3:
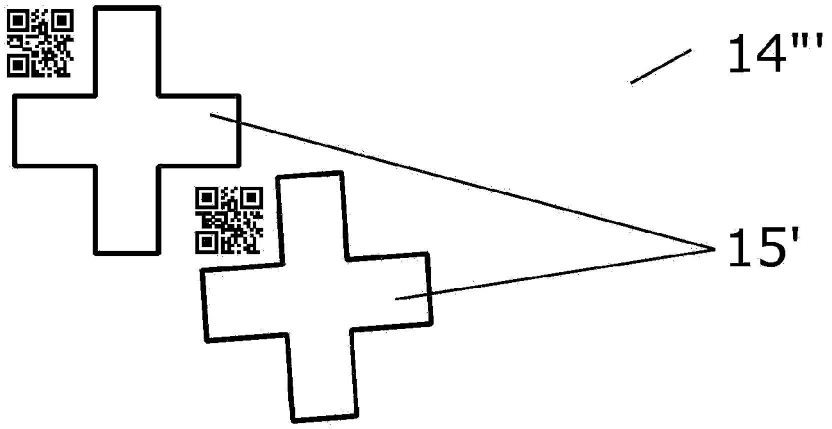
FIG. 3 is a plan view of an embodiment of an adjustment marking field with adjustment marks.

FIG. 3 shows a detail of a possible embodiment of an adjustment marking field 14", wherein the individual exemplary adjustment marks 15' are supplemented with a machine-readable code. Individual adjustment marks 15 can be arranged on different planes (steps and/or layers) and can contain in the code information regarding which plane is concerned. Furthermore, an unequivocal indication of the position and location of respective adjustment mark 15' can be contained in the code.

Figure 4:
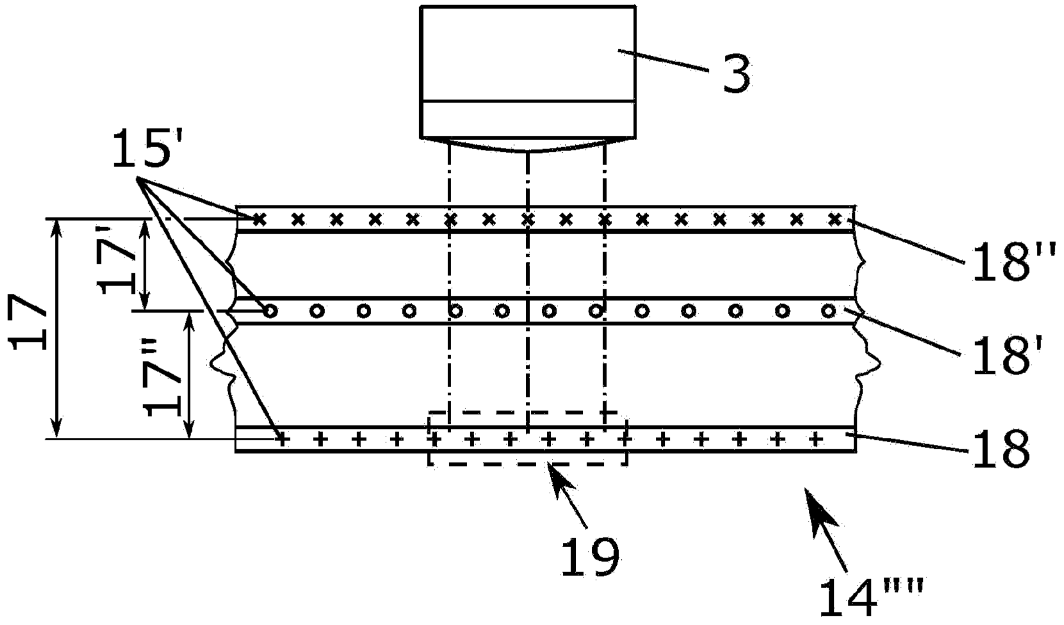
FIG. 4 is a cross-sectional view of an embodiment of an adjustment marking field with a detection unit.

In FIG. 4, an embodiment of an adjustment marking field 14"" is represented in a cross-sectional view. Adjustment marks 15' of adjustment marking field 14"" are arranged in three different planes 18, 18', 18" and can be detected by detection unit 3. Detection unit 3 can only detect adjustment marks 15' inside focal range 19. It is also conceivable that detection unit 3 uses electromagnetic radiation of different wavelength, in order to detect adjustment markings of different planes arranged one above the other. The adjustment marking field is then correspondingly at least partially transparent for the different wavelengths.

A first plane 18 has a known distance 17" with the respect to second plane 18'. Second plane 18' likewise has a known distance 17' with respect to the third plane 18". In addition, the distance 17 between first plane 18 and third plane 18" is known. Distance 17" and distance 17' are of different size in the represented embodiment, so that when adjustment marking field 14"" is used for the adjustment of a detection means, all three distances 17, 17' and 17" can be approached or adjusted. The difference distances between detection means 3 and an adjustment marking can thus be detected. At the same time, the known distance from another plane can advantageously be approached.

Combinations of distances 17, 17', 17" can also be approached by multiple movement of the substrate holder 9 fixed with respect to adjustment marking field 14"", which can be carried out as a focusing movement of detection means 3. For example, focused distance 17" can first be adjusted and subsequently distance 17' can also be approached in the same direction. For example, the substrate holder can also be moved by twice the distance 17". For this purpose, alignment takes place in two steps and the detection unit is correspondingly adjusted between the steps, since a focal position and therefore focal range 19 of detection unit 3 is adapted.

Figure 5A:
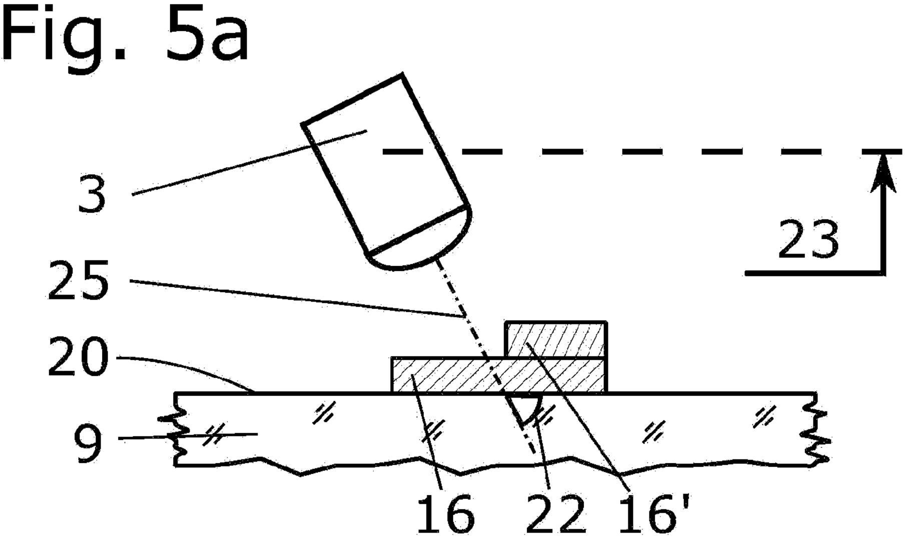
FIG. 5*a* is a detection unit in a first position.
Figure 5B:
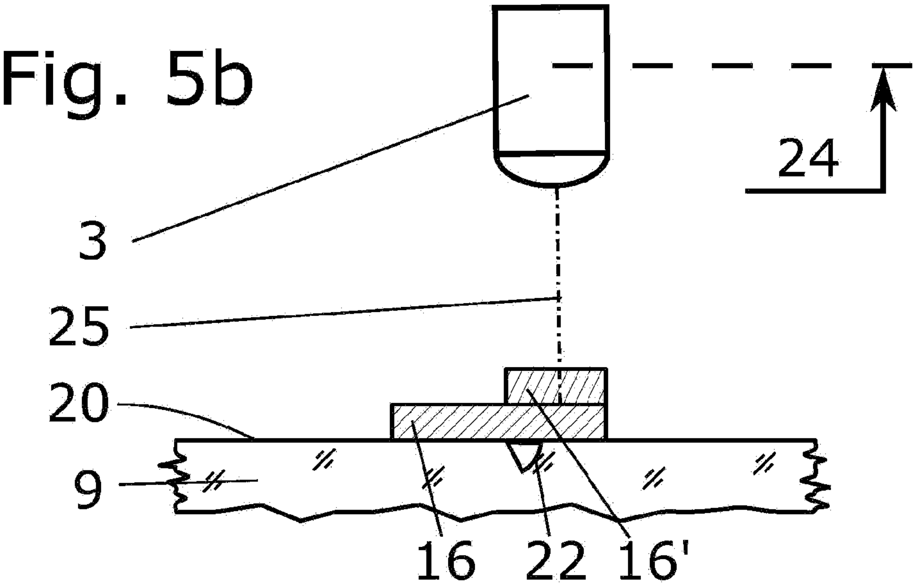
FIG. 5*b* is the detection unit in a second position.

FIGS. 5*a* and 5*b* represent optics 3 in a first position 23 and in a second position 24 (after an adjustment). The wedge error (angle 22) between optics 3 and the substrate holder, i.e. the angular error between an optical axis 25 of optics 3 and substrate holder surface 20 of substrate holder 9, is present in first position 23 and in second position 24 is compensated for or is no longer present. Optics 3 can thus advantageously be adjusted with the aid of the detection of two adjustment markings of different planes 18, 18', 18".

LIST OF REFERENCE NUMBERS

1 alignment system with device for adjusting a detection means
2 optical system
3 detection means, detection unit, optics
4 positioning device
5 additional measurement system
6 detection unit for substrate holder rear side, additional detection means
7 positioning device of the additional measurement system
8 frame, table
9 substrate holder, first substrate holder (to be aligned)
10 movement arrangement of the substrate holder to be aligned
11 second substrate holder
12 second movement arrangement
13 substrate deformation device
14, 14', 14", 14'" adjustment marking field, alignment marking field
15, 15' adjustment marks, adjustment markings, reference markings
16, 16' layers of an adjustment marking field
17, 17', 17" distance between the adjustment marks arranged one above the other
18, 18', 18" planes of the adjustment marking field
19 focal range of the detection means, focal range of the optics
20 substrate holder surface
21, 21' elevations, pins, studs
22 angle, wedge error
23 first position
24 second (adjusted) position
25 optical axis

What is claimed is:

1. A device for adjusting a detection means, at least comprising:

a substrate holder for mounting a substrate, the substrate holder comprising, on a substrate holder surface, regularly arranged elevations for providing a substrate mounting surface;

one or more adjustment marking fields with adjustment marks arranged fixed with respect to the substrate holder, the adjustment marking fields being arranged regularly offset with respect to one another between the elevations; and the detection means for detecting the adjustment marks, characterised in that the detection means being adjustable relative to the substrate holder with aid of the adjustment marks of the adjustment marking fields arranged one above the other.

2. The device according to claim 1, wherein the adjustment marks of the adjustment marking field are arranged in a first plane and a second plane, and, wherein the first plane and the second plane are parallel with one another, and wherein the first plane and the second plane have a distance from one another.

3. The device according to claim 2, wherein the adjustment marks of the first plane and the adjustment marks of the second plane are arranged aligned one above the other.

4. The device according to claim 2, wherein the adjustment marks of the first plane and the adjustment marks of the second plane are arranged one above the other and regularly offset with respect to one another.

5. The device according to claim 2, wherein the adjustment marks of the first plane and the adjustment marks of the second plane are arranged step-like offset with respect to one another on different layers.

6. The device according to claim 2, wherein one of the first and second planes lies on the substrate holder surface.

7. The device according to claim 1, wherein the detection means is adjustable by a relative movement between the detection means and the substrate holder.

8. The device according to claim 1, wherein the detection means is adjustable by a change of focus of the detection means.

9. The device according to claim 1, wherein the adjustment marks each comprise an individual information content that is detectable by the detection means.

10. The device according to claim 1, wherein the detection means is an optical detection means.

11. The device according to claim 10, wherein the optical detection means is a lens with a definable optical central axis.

12. The device according to claim 1, wherein the at least one of the adjustment marking fields is completely embedded in the substrate holder and is arranged at least partially beneath the substrate holder surface.

13. The device according to claim 1, wherein the detection means (3, 6) can be used for reading out alignment markings of a substrate.

14. A method for the adjustment of a detection means, comprising:

providing a substrate holder with one or more adjustment marking fields with adjustment marks arranged fixed with respect to the substrate holder, the substrate holder including, on a substrate holder surface, regularly arranged elevations for providing a substrate mounting surface, the adjustment marking fields being arranged regularly offset with respect to one another between the elevations; and adjusting the detection means relative to the substrate holder with aid of the adjustment marks of the adjustment marking fields arranged one above the other.

15. The method according to claim 14, wherein the adjusting the detection means comprises:

detecting a first one of the adjustment marks of a first plane of one of the adjustment marking fields;

detecting, after the detecting the first one, a second one of the adjustment marks of a second plane of the one of the adjustment marking fields;

determining, after the detecting the second one, a wedge error between the detection means and the substrate holder; and compensating the determined wedge error, wherein the first plane and the second plane are arranged parallel with one another, and wherein the first plane and the second plane have a distance from one another.

* * * * *